United States Patent
Farooq et al.

(10) Patent No.: US 9,728,506 B2
(45) Date of Patent: Aug. 8, 2017

(54) STRAIN ENGINEERING DEVICES USING PARTIAL DEPTH FILMS IN THROUGH-SUBSTRATE VIAS

(71) Applicant: GLOBALFOUNDRIES INC., Grand Cayman (KY)

(72) Inventors: Mukta G. Farooq, Hopewell Junction, NY (US); Joyce C. Liu, Carmel, NY (US); Jennifer A. Oakley, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/957,860

(22) Filed: Dec. 3, 2015

(65) Prior Publication Data

US 2017/0162508 A1 Jun. 8, 2017

(51) Int. Cl.
*H01L 23/52* (2006.01)
*H01L 23/538* (2006.01)
*H01L 29/06* (2006.01)
*H01L 21/768* (2006.01)
*H01L 21/02* (2006.01)
*H01L 21/762* (2006.01)

(52) U.S. Cl.
CPC ...... *H01L 23/5384* (2013.01); *H01L 21/0228* (2013.01); *H01L 21/762* (2013.01); *H01L 21/76843* (2013.01); *H01L 21/76877* (2013.01); *H01L 23/5386* (2013.01); *H01L 29/0642* (2013.01)

(58) Field of Classification Search
CPC ............. H01L 23/5384; H01L 23/0228; H01L 21/76877; H01L 21/762; H01L 21/02107
USPC ......................................................... 257/774
See application file for complete search history.

(56) References Cited

U.S. PATENT DOCUMENTS

| | | | | |
|---|---|---|---|---|
| 6,309,924 B1 * | 10/2001 | Divakaruni | ....... | H01L 27/10861 257/E21.651 |
| 6,319,787 B1 * | 11/2001 | Enders | .............. | H01L 27/10829 257/E21.651 |
| 6,534,376 B2 * | 3/2003 | Tews | .................... | H01L 27/1087 438/243 |
| 7,122,439 B2 * | 10/2006 | Kwon | ............... | H01L 29/66181 438/242 |
| 8,026,592 B2 * | 9/2011 | Yoon | ................. | H01L 21/76898 257/698 |
| 8,053,902 B2 * | 11/2011 | Chen | ................. | H01L 21/76898 257/508 |
| 8,138,577 B2 * | 3/2012 | Shi | ....................... | H01L 21/6835 257/621 |
| 8,877,559 B2 * | 11/2014 | Gao | ................. | H01L 21/76898 257/774 |

(Continued)

FOREIGN PATENT DOCUMENTS

WO 2013184880 A1 12/2013

*Primary Examiner* — Luan C Thai
(74) *Attorney, Agent, or Firm* — Scully Scott Murphy and Presser; Frank Digiglio

(57) ABSTRACT

Through-substrate vias (TSVs) include a strain engineering layer configured to minimize or otherwise control local stress fields. The strain engineering layer can be separate from and in addition to a TSV sidewall isolation layer that is deposited along the via sidewall surface for the purpose of electric isolation. For instance, the strain engineering layer can be a partial depth layer that extends over only a portion of the TSV sidewall.

18 Claims, 4 Drawing Sheets

(56) References Cited

U.S. PATENT DOCUMENTS

| | | |
|---|---|---|
| 8,980,715 B2 | 3/2015 | Grill et al. |
| 9,006,102 B2 | 4/2015 | Hong et al. |
| 9,059,262 B2 * | 6/2015 | Liu .................. H01L 21/76898 |
| 2013/0249011 A1 | 9/2013 | Choi et al. |
| 2015/0054139 A1 | 2/2015 | Gao et al. |
| 2015/0069579 A1 | 3/2015 | Yu et al. |

* cited by examiner

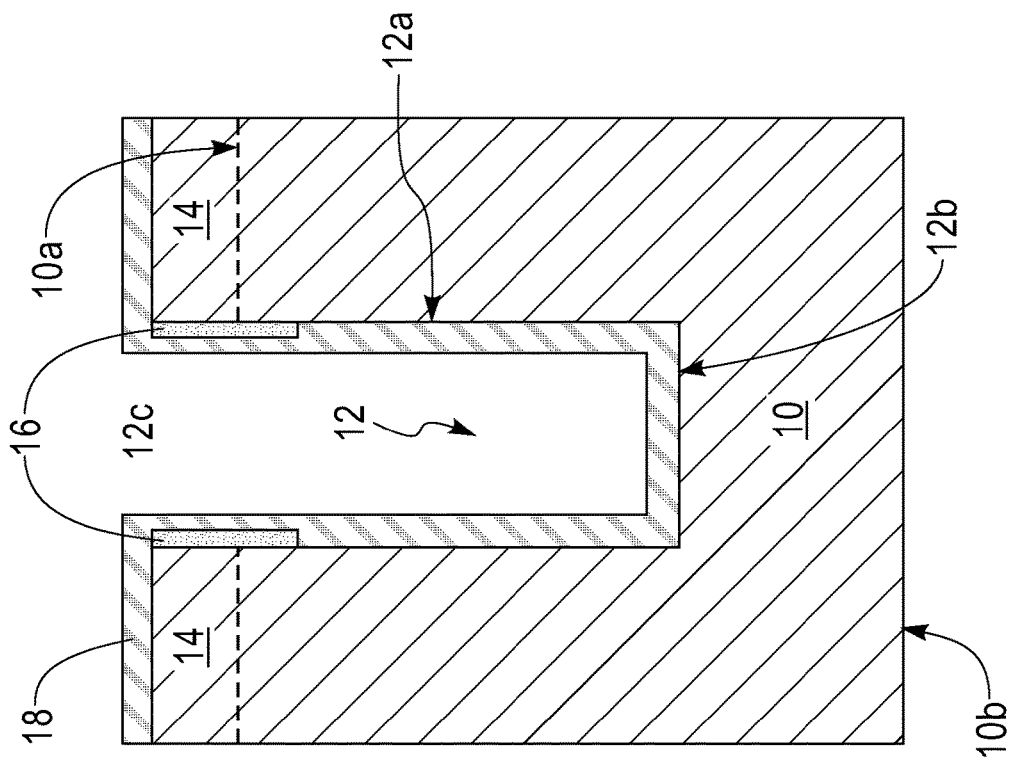
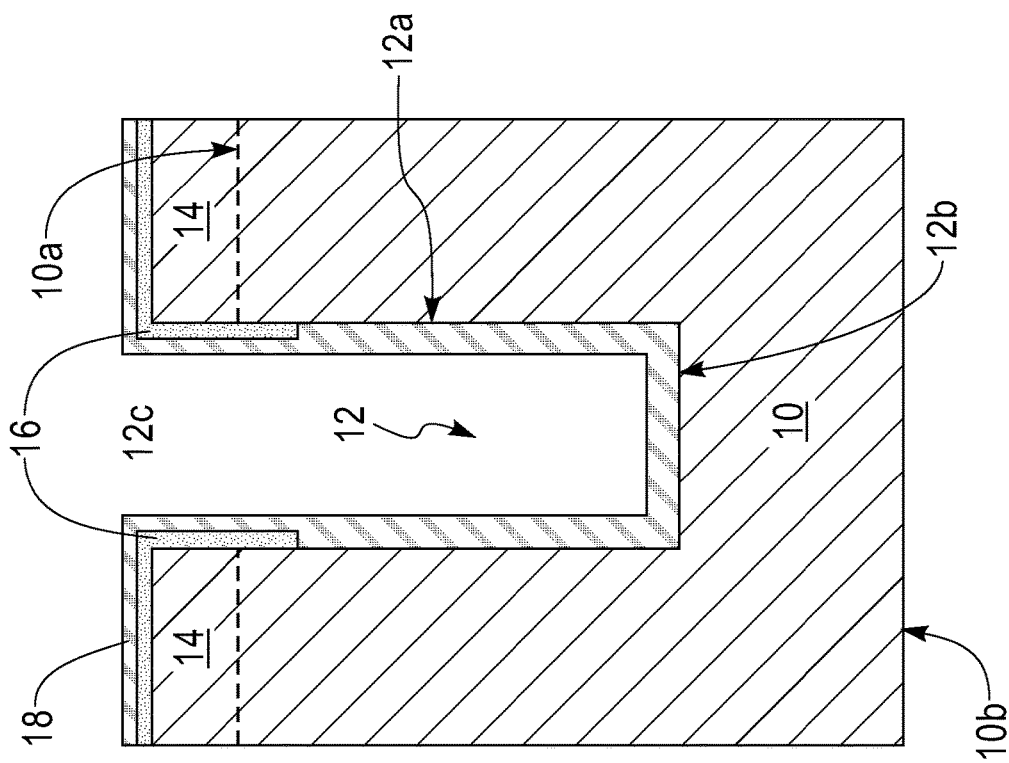

STRAIN ENGINEERING DEVICES USING PARTIAL DEPTH FILMS IN THROUGH-SUBSTRATE VIAS

BACKGROUND

The present application relates generally to electronic devices, and more specifically to strain-engineered electronic devices and their methods of production.

In the electronics industry, packaging density continuously increases in order to accommodate more electronic devices into a package. In this regard, three-dimensional (3D) stacking technology of wafers and/or chips contributes to the device integration process. Typically, a semiconductor wafer (a semiconductor device/substrate) or chip (a semiconductor device) includes several layers of integrated circuitry (e.g., processors, programmable devices, memory devices, etc.) built on a silicon substrate. A top layer of the wafer may be connected to a bottom layer of the wafer through silicon interconnects or vias. Typical vias include conductive material formed in cavities in the semiconductor substrate that electrically connect conductive contacts disposed in different areas of a device. In order to form a 3D wafer stack, two or more wafers are placed on top of one other and bonded together.

The formation of through-substrate vias (TSVs) typically includes etching or drilling into the substrate to form openings, and then filling the openings with a conductive material. Excess conductive material may be removed, e.g., via planarization using chemical mechanical polishing. The remaining portions of the conductive material in the substrate form the TSVs.

The formation of the through-substrate via creates an adjacent stress field in the substrate. It has been observed that the induced stress and its attendant strain field may have an adverse effect on the performance of devices located proximate to the TSVs. Thus, it would be advantageous to form strain engineered TSVs whose negative impact on neighboring devices is minimized

SUMMARY

In accordance with embodiments of the present application, a device includes a substrate having a front side and a back side, a via such as a through-substrate via that extends from the front side and at least partially through a thickness of the substrate, and a strain engineering layer disposed over a portion of a sidewall of the via.

According to further embodiments, a device includes a through-substrate via that extends from a front side of a substrate at least partially through a thickness of the substrate, and a strain engineering layer disposed over a portion of a sidewall of the via. The substrate may comprise a semiconductor substrate.

A method of making a device includes forming a via that extends from a front side of a semiconductor substrate at least partially through a thickness of the substrate, and forming a strain engineering layer over a portion of a sidewall of the via.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 2 is a schematic cross sectional view of a portion of a device comprising a through-substrate via and a strain engineering layer according to one embodiment;

FIG. 3 is a schematic cross sectional view of a portion of a device comprising a through-substrate via and a strain engineering layer according to a further embodiment;

DETAILED DESCRIPTION

Figure 1:
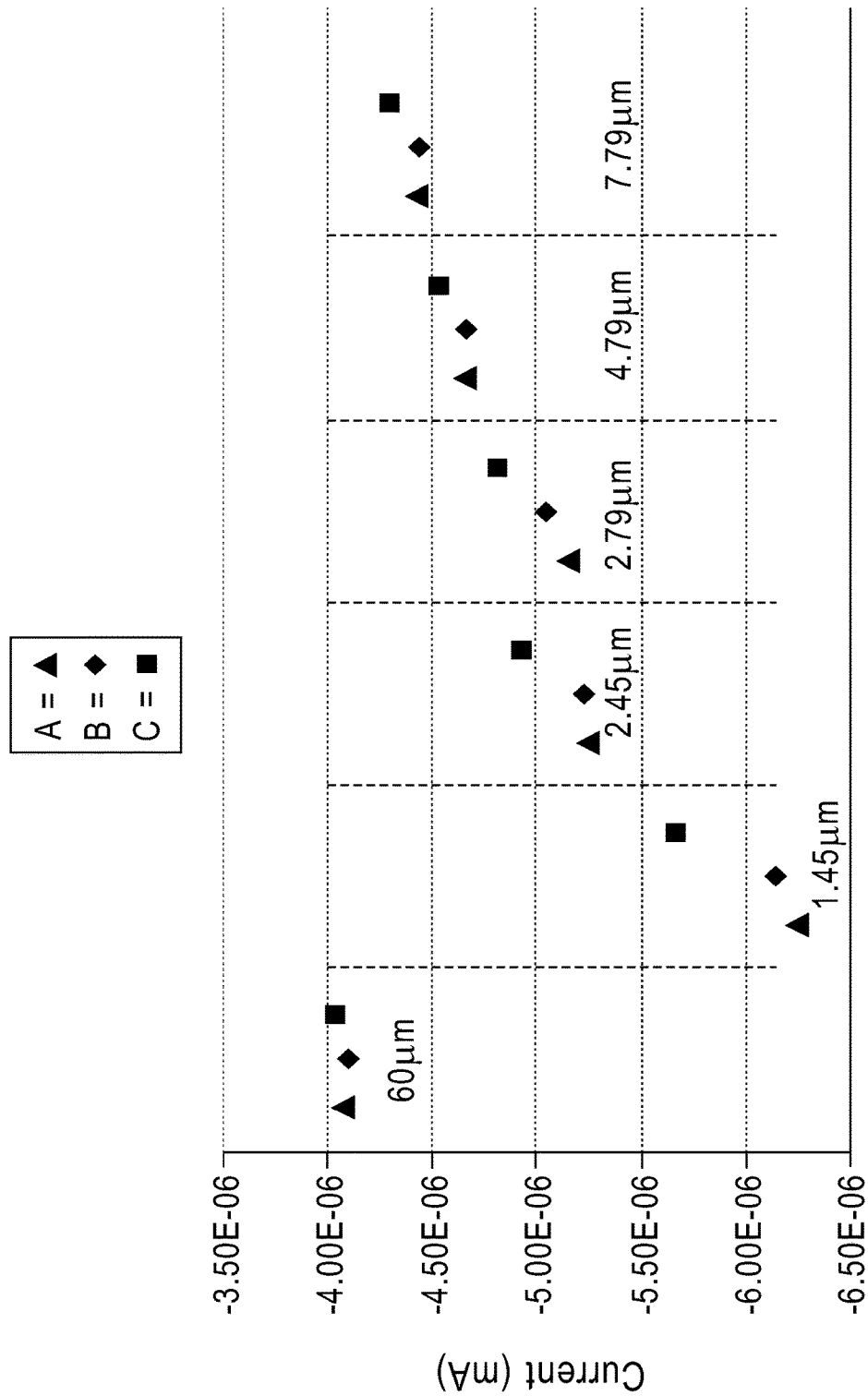
FIG. 1 is a plot illustrating the impact on device performance of a through-substrate via.

Reference will now be made in greater detail to various embodiments of the subject matter of the present application, some embodiments of which are illustrated in the accompanying drawings. The same reference numerals will be used throughout the drawings to refer to the same or similar parts.

Through-substrate vias (TSVs) are vertical electrical connections that pass at least partially though an electronic device substrate such as a silicon wafer or die. TSVs may be used as an alternative to wire-bonding or flip chip approaches to create 3D packages and 3D integrated circuits.

Associated with TSVs is a local stress field, which has been observed to have a deleterious effect on the performance of devices located within or proximate to the stress field. Devices that are not strain engineered, such as long channel transistors or devices having thick gate oxide/dielectric layers, are particularly susceptible to the stress field of a neighboring TSV.

Without wishing to be bound by theory, the TSV-induced stress is believed to derive from a mismatch in coefficient of thermal expansion (CTE) between the substrate and the conductive material used to fill the via.

By way of example, and with reference to FIG. 1, thick gate oxide, long channel PFETs (channel length ~100 nm) located within 5 microns of a TSV (TSV diameter ~6 microns) exhibit measurable variation in linear drain current (Idlin). These effects are substantially reduced, however, at device-to-TSV distances greater than 10 microns (e.g., at a distance of 60 microns as shown).

Moreover, it is observed that the TSV stress field is strongly influenced by the oxide isolation layer surrounding the TSV, where decreasing the thickness of the oxide layer decreases the Idlin shift of the device in close proximity to the TSV.

The oxide isolation layer may be a single layer or a composite layer such as a stack comprising both a sub-atmospheric pressure chemical vapor deposition (SACVD) oxide layer, which is deposited on the substrate, and a plasma enhanced chemical vapor deposition (PECVD)

oxide layer deposited on the SACVD layer. Example CVD oxide layers are deposited from a tetraethylorthosilicate (TEOS) source, though other deposition processes and/or starting materials can be used. As depicted with reference to the key in FIG. 1, the SACVD layer thickness is either: (A) 800 nm, (B) 600 nm, or (C) 400 nm, while the PECVD layer thickness is 300 nm. With reference still to FIG. 1, the strain-induced effect is notable within the 5 micron KOZ (keep out zone). Comparable device shift effects are observed for larger diameter TSVs (TSV diameter ~19 microns).

Data summarizing percent Idlin shift for 800 nm and 400 nm SACVD oxide layer thicknesses (300 nm PECVD oxide) with respect to a control sample are summarized in Table 1 as a function of distance from the periphery of a TSV. The data show that the extent of the current shift decreases with increasing distance from the via, and with decreasing thickness of the oxide isolation layer.

TABLE 1

Relative Idlin shift as a function of device-to-TSV distance

| Distance to TSV | 800/300 nm oxide isolation layer | 400/300 oxide isolation layer |
|---|---|---|
| 1.5 microns | 17.26% | 14.73% |
| 2.5 microns | 14.62% | 11.40% |
| 3.5 microns | 11.61% | 9.61% |
| 4.5 microns | 10.40% | 8.72% |
| 7.5 microns | 7.47% | 6.10% |

In embodiments, neutralization of the TSV stress field and its attendant effects on adjacent devices would beneficially minimize the KOZ associated with each TSV thereby enabling increased device packaging density. In further embodiments, manipulation of the TSV stress field may enhance the performance of a device, e.g., a transistor, located proximate to the TSV. For instance, the position of a device in relation to a TSV, the engineering of the TSV stress field, and the choice of the type of device, can be cooperatively chosen so as to result in improved device performance for the device located within or proximate to the TSV stress field. For instance, and without wishing to be bound by theory, an induced tensile strain in the channel region may beneficially impact performance of an n-MOSFET, while a compressive strain in the channel region may beneficially impact performance of a p-MOSFET.

Thus, disclosed are TSV architectures that may beneficially manipulate the TSV stress field for strain engineering of specific devices. In embodiments, through-substrate vias comprise a strain engineering layer that (at least partially) offsets the intrinsic stress state of the via, and thus reduces the TSV stress field. For instance, the strain engineering layer may decrease the magnitude of the average or maximum stress associated with the TSV. In further embodiments, the strain engineering layer increases the magnitude of the average or maximum stress associated with the TSV. By way of example, the strain engineering layer may make an existing tensile (or compressive) stress more or less tensile (or compressive). By way of a further example, the strain engineering layer may make an existing tensile stress compressive or an existing compressive stress tensile.

An illustrative method of forming a through-substrate via in a substrate 10 according to an embodiment is depicted in FIG. 2. Substrate 10 has a front side 10a and a back side 10b. In one embodiment, substrate 10 may be formed from a suitable semiconducting material, such as silicon, silicon germanium, silicon carbide, gallium arsenide, or other semiconducting material. Alternatively and in another embodiment, substrate 10 may be formed of a dielectric material such as silicon oxide.

Typically, integrated circuits comprising, for example, transistors and interconnects are fabricated in and/or on the front side 10a of the substrate 10. These active elements, which may be included together with one or more deposited layers, are shown collectively as active layer 14.

A recessed via 12 is formed by lithography and etching through the active layer 14 and into the substrate 10. Recessed via 12 conventionally has a circular cross section and comprises a via sidewall 12a and a bottom surface 12b. Example vias have a depth of 20 to 200 microns and a diameter of 1 to 100 microns. The via sidewall 12a may be vertical or tapered. The aspect ratio (ratio of depth to diameter) of a via having a cylindrical cross section typically ranges from about 2 to 20.

In the illustrated embodiment, a strain engineering layer 16 is formed inside the via over at least an upper portion of the via sidewall 12a and the exposed sidewall of the active layer 14. The upper portion of the via sidewall 12a is adjacent via opening 12c, while the lower portion of the via sidewall 12a is adjacent via bottom surface 12b. In embodiments, the strain engineering layer 16 is in direct physical contact with via sidewall 12a, and thus in direct physical contact with the substrate 10. As shown in FIG. 2, the strain engineering layer 16 may also cover (at least a portion of) the top surface of the active layer 14.

According to embodiments, the strain engineering layer 16 is a partial depth layer that is not formed over a lower portion of the sidewall 12a nor over the via bottom surface 12b. Thus, in embodiments, the strain engineering layer 16 partially covers the sidewall 12a. By way of example, from the via opening 12c the strain engineering layer 16 may extend along an upper portion of the sidewall 12a to a depth that is 1% to 50% of the depth of the via (e.g., 1, 2, 5, 10, 20 or 50% of the depth, including ranges between any of the foregoing). In embodiments, the extent of the depth of penetration of the strain engineering layer 16 into the via may be up to about 10 microns.

The strain engineering layer 16 may be a tensile layer or a compressive layer. In embodiments, the strain engineering layer 16 may be an insulating layer or a conductive layer. For instance, the strain engineering layer 16 may be an oxide layer (e.g., $SiO_2$), a nitride layer (e.g., $Si_3N_4$) or an oxynitride layer (e.g., $SiO_xN_y$).

A strain engineering layer 16 thickness may range from 100 Angstroms to 1 micron (e.g., 100, 500, 1000, 2000, 4000, 6000, 8000 or 10000 Angstroms, including ranges between any of the foregoing). The thickness of the strain engineering layer 16 may be variable, e.g., variable as a function of via depth. For instance, the thickness of the strain engineering layer 16 may increase or decrease with position as a function of its depth within the via.

Figure 4:
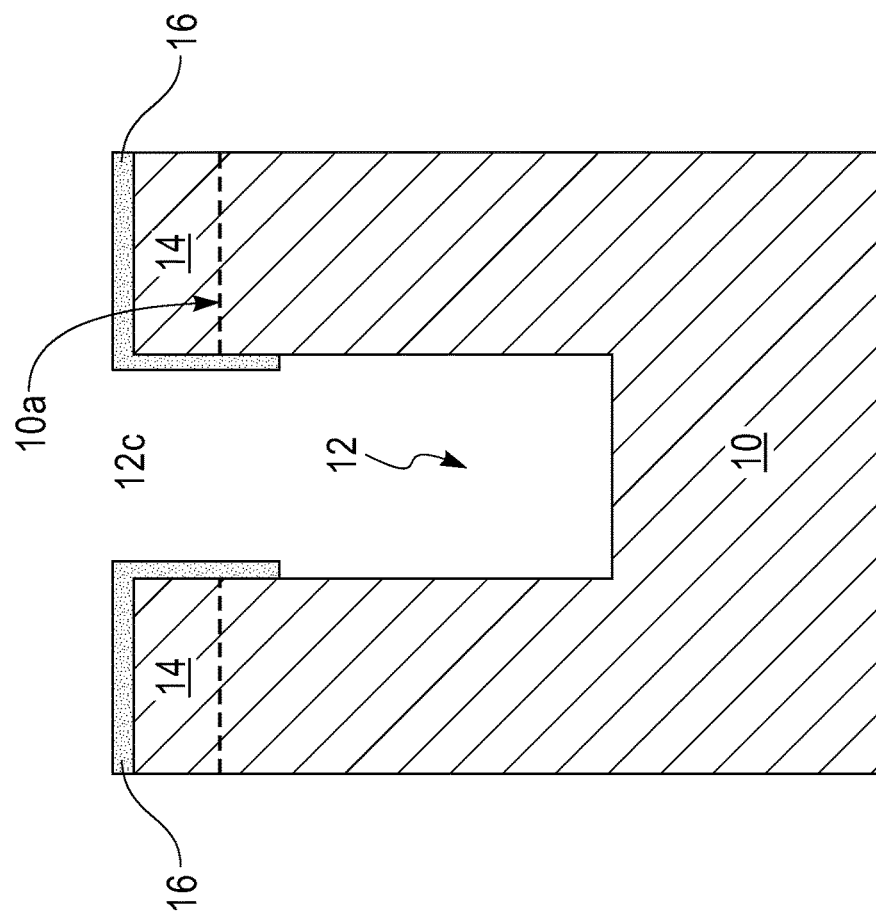
FIG. 4 is a schematic cross sectional view of a portion of a device comprising a through-substrate via and a strain engineering layer according to a still further embodiment.

With reference to FIGS. 2 and 3, a conformal sidewall isolation layer 18 such as an oxide layer is formed over the strain engineering layer 16, the exposed portion of the via sidewall 12a, and the via bottom surface 12b. In the embodiment illustrated in FIG. 2, the strain engineering layer 16 is formed over an upper portion of the via sidewall 12a and over a top surface of the active layer 14. In an alternate embodiment illustrated in FIG. 3, the strain engineering layer 16 is formed only over a portion (upper portion) of the via sidewall 12a. A conformal barrier layer (not shown) such as a TiN, TaN, TiW or TaCN layer may be formed over the sidewall isolation layer 18. The conformal barrier layer may inhibit or prevent diffusion of the via fill metal from the via. The structure of FIG. 1 prior to the formation of the isolation layer is shown in FIG. 4.

By way of example, the strain engineering layer 16, the sidewall isolation layer 18, and the barrier layer (if provided) may be formed by atomic layer deposition (ALD), chemical vapor deposition (CVD) or physical vapor deposition (PVD) methods.

A further deposition process is carried out to fill the recessed via 12 with a conductive material (not shown). An example conductive material used to fill the recessed via 12 is copper, though other conductive materials, including metals and metal alloys may be used. Example metals include tungsten, aluminum, tin, silver and gold. In embodiments, the top surface of the conductive material is initially higher than the top surface of the sidewall isolation layer 18. Chemical mechanical polishing (CMP) is performed to remove excess conductive material.

Figure 5:
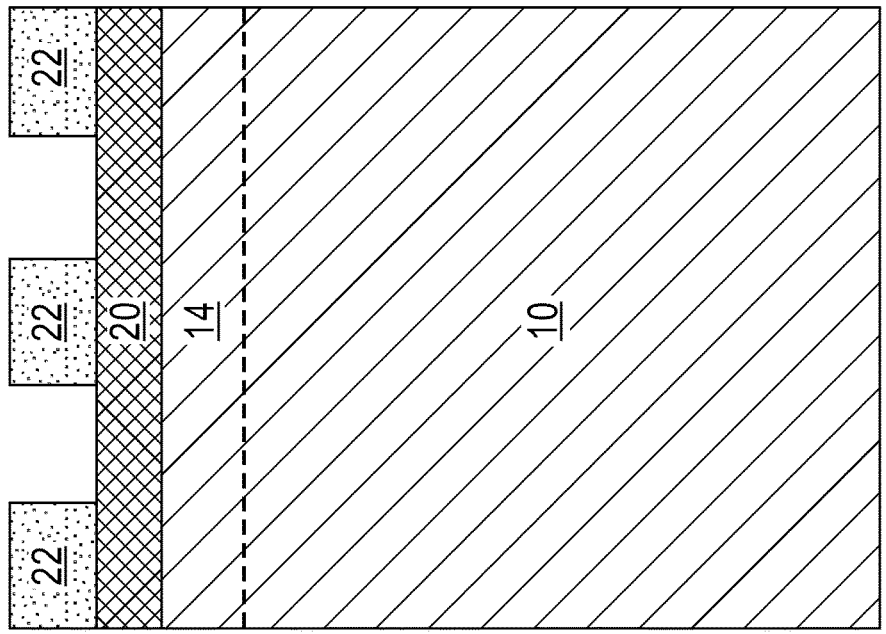
FIG. 5 is a schematic cross sectional view showing the patterning of a substrate in a method of manufacturing a device comprising a through-substrate via according to an embodiment.
Figure 7:
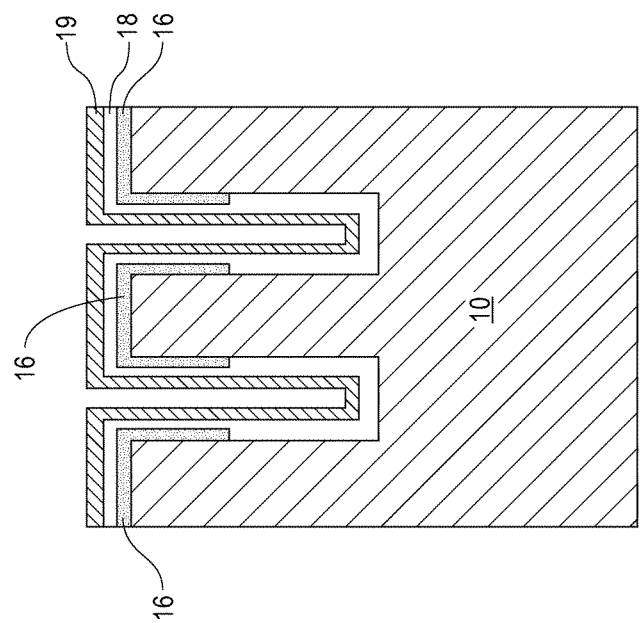
FIG. 7 is a schematic cross sectional view a strain engineering layer formed over a portion of a sidewall of through-substrate via.
Figure 6:
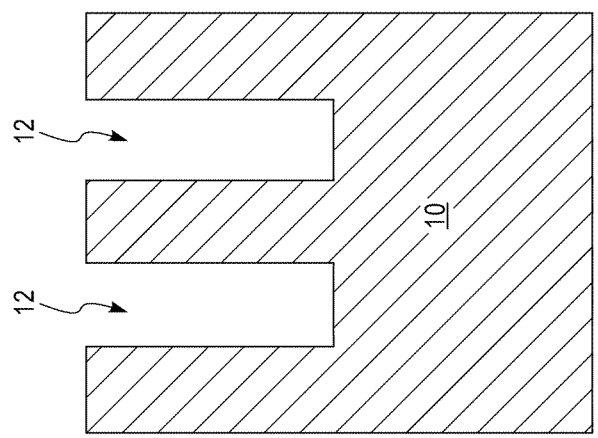
FIG. 6 is a schematic cross sectional view showing the etching of a substrate in a method of manufacturing a device comprising a through-substrate via according to an embodiment.

According to embodiments, FIGS. 5-7 are a series of cross-sectional views showing various stages in the manufacture of a device comprising a strain engineering layer 16 disposed over a portion of a sidewall of a through-substrate via. FIG. 5 shows substrate 10 having a photoresist pattern disposed over a surface thereof. Substrate 10 may comprise, for example, doped or undoped bulk silicon, or an active layer of a semiconductor-on-insulator (SOI) substrate. An SOI substrate typically comprises a layer of a semiconductor material, such as silicon, formed on an insulator layer. The insulator layer may be, for example, a silicon oxide layer or a buried oxide (BOX) layer.

A dielectric layer 20 is disposed over a top surface of the substrate. A photoresist layer 22 is then deposited over the dielectric layer 20 and the photoresist layer 22 is patterned with openings. The dielectric layer 20 is a sacrificial layer used to protect the substrate surface during the etching process used for form through-substrate vias.

The material for the dielectric layer 20 can be any dielectric material, such as silicon dioxide, silicon nitride, or a combination of both. One example of a material for the dielectric layer 20 is silicon oxide deposited by plasma enhanced chemical vapor deposition using TEOS (tetraethylorthosilicate) as the silicon source. A PECVD silane oxide film can also be used. In some embodiments, the TEOS oxide has a thickness between about 50 nm to about 1000 nm. The dielectric layer 20 can be a spin-on dielectric (SOD) or a spin-on glass (SOG). The dielectric layer 20 can also be deposited (or grown) by a thermal process, such as a thermally grown silicon dioxide, or an oxide film deposited by thermal CVD.

In embodiments, substrate 10 includes circuitry and other active components formed therein before the photoresist layer 22 is deposited and patterned. The electrical circuitry, which is shown collectively as active layer 14, may be any type of circuitry suitable for a particular application. Such circuitry may include electrical devices formed on the substrate with one or more dielectric layers overlying the electrical devices. Metal layers may be formed between dielectric layers to carry electrical signals between the devices.

Example circuitry may include various n-type metal-oxide semiconductor (NMOS) and/or p-type metal-oxide semiconductor (PMOS) devices, such as transistors, resistors, capacitors, fuses, diodes, and the like, interconnected to perform one or more functions. The functions may include processing, memory, sensing, amplification, power distribution, input/output, etc.

One of ordinary skill in the art will appreciate that the above examples are provided for illustrative purposes only and are not meant to limit the present application. Other circuitry may be used as appropriate for a given application.

Active layer 14 may optionally comprise an etch stop layer (not shown), e.g., formed at the interface with substrate 10, and an interlayer dielectric (ILD) layer (not shown). In some embodiments, the etch stop layer is a dielectric material having a different etch selectivity from adjacent layers, e.g., the underlying substrate 10 and an overlying ILD layer. The etch stop layer may be formed of silicon nitride or carbon nitride, for example, by chemical vapor deposition or plasma enhanced chemical vapor deposition techniques.

The ILD layer may be formed, for example, of a low-k dielectric material, such as silicon oxide, phosphosilicate glass (PSG), borophosphosilicate glass (BPSG), fluorinated silicate glass (FSG), SiOC, spin-on-glass, spin-on-polymers, or silicon carbon, for example, by any suitable method such as spinning, CVD, and PECVD. A low-k dielectric material, as defined herein, has a dielectric constant of less than 4.

Contacts may be formed through the ILD layer to provide an electrical contact to the electrical circuitry. The contacts may be formed, for example, using photolithography techniques to deposit and pattern a photoresist material on the ILD layer to expose portions of the ILD layer that are to become the contacts. An etch process, such as an anisotropic dry etch process, may be used to create openings in the ILD layer. The openings may be lined with a diffusion barrier layer and/or an adhesion layer, and filled with a conductive material. The diffusion barrier layer may comprise one or more layers of tantalum, tantalum nitride, titanium, titanium nitride, and combinations thereof, and the conductive material may comprise copper, tungsten, aluminum, silver, and combinations thereof.

FIG. 6 shows substrate 10 after vias 12 have been etched in accordance with some embodiments. In an embodiment, a timed etching process, such as an anisotropic dry etch process, is performed until a desired depth for the vias 12 is obtained in the substrate. It will be understood that the etch process may be performed as a single etch process or multiple etch process. The etching process(es) can be a dry process or a wet process.

In some embodiments, the depths of vias 12 may range from about 20 microns to about 200 microns. In some embodiments, the widths of vias 12 may range from about 5 microns to about 100 microns. In embodiments the dielectric layer 20 is first etched opened and used as a patterning mask for etching of the vias 12.

After the through-substrate vias 12 have been etched, the sacrificial dielectric layer 20 and the photoresist 22 are removed, and a strain engineering layer 16 is formed at least over a portion of the sidewall 12a of the vias.

The strain engineering layer 16 may be made of a dielectric material, such as oxide, nitride, or a combination of both. One example of a material for the isolation layer is silicon oxide deposited by plasma enhanced chemical vapor deposition (PECVD) using silane or TEOS as the silicon source.

After the strain engineering layer 16 is formed, the via openings are filled. FIG. 7 shows substrate 10 including vias 12 that are first partially lined with a strain engineering layer 16. A conformal isolation layer 18 is formed over the strain engineering layer and a barrier/seed layer 19 is formed over the isolation layer 18, in accordance with some embodiments.

The isolation layer 18 is made of a dielectric material, such as oxide, nitride, or a combination of both. One example of a material for the isolation layer 18 is silicon oxide deposited by plasma enhanced chemical vapor deposition (PECVD) using silane or TEOS as the silicon source. In some embodiments, the isolation layer 18 has a thickness between about 50 nm to about 1500 nm. The isolation layer 18 can also be deposited (or grown) by a thermal process, such as a thermally grown oxide, or a thermal CVD oxide. Alternatively, the isolation layer 18 can be a doped film, using dopants such as phosphorus, boron, or phosphorus.

After the strain engineering layer 16 and the isolation layer 18 are deposited, the via is filled according to conventional methods. Filling of the via may comprise conformal deposition first of a barrier layer over the isolation layer and a seed layer over the barrier layer (collectively barrier/seed layer 19) followed by deposition of a metal film (e.g., copper) that fills the vias.

Disclosed are through-substrate vias (TSVs) comprising a strain engineering layer configured to influence local TSV stress fields. The strain engineering layer can be separate from and in addition to a sidewall isolation layer that is deposited along the via sidewall surface for the purpose of electric isolation. In embodiments, the strain engineering layer is a partial depth layer that extends over only a portion of the TSV sidewall.

As used herein, the singular forms "a," "an" and "the" include plural referents unless the context clearly dictates otherwise. Thus, for example, reference to a "strain engineering layer" includes examples having two or more such "strain engineering layers" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

As used herein, a layer or region "disposed over" a substrate or other layer refers to formation above, or in contact with, a surface of the substrate or layer. For example, where it is noted or recited that a layer is disposed over a substrate or other layer, it is contemplated that intervening structural layers may optionally be present between the layer and the substrate.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to an isolation layer that comprises an oxide material include embodiments where an isolation layer consists essentially of an oxide material and embodiments where an isolation layer consists of an oxide material.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A device comprising:
   a substrate having a front side and a back side, the front side comprising an active layer;
   a via that extends from the front side and at least partially through a thickness of the substrate; and
   a strain engineering layer disposed over only an upper portion of a sidewall of the via and directly over at least a portion of a top surface of the active layer.

2. The device of claim 1, wherein the substrate is a semiconductor substrate.

3. The device of claim 1, wherein the strain engineering layer is in direct physical contact with the sidewall.

4. The device of claim 1, further comprising a conformal isolation layer disposed over the strain engineering layer.

5. The device of claim 1, further comprising a conformal isolation layer disposed directly over the substrate along a lower portion of the sidewall.

6. The device of claim 1, wherein the strain engineering layer comprises an oxide, a nitride or an oxynitride.

7. The device of claim 1, wherein the strain engineering layer thickness is from 100 A to 1 micron.

8. The device of claim 1, wherein the strain engineering layer extends along an upper portion of the sidewall to a depth that is from 1% to 50% of the depth of the via.

9. The device of claim 1, wherein the device comprises a transistor fabricated in the active layer.

10. A device comprising:
    a through-substrate via that extends from a front side at least partially through a thickness of a substrate; and
    a strain engineering layer disposed over only a portion of a sidewall of the via and in direct contact with a top surface of the substrate adjacent to the via and within the via.

11. The device of claim 10, wherein the strain engineering layer is disposed over an upper portion of the sidewall.

12. The device of claim 10, further comprising an isolation layer disposed over the strain engineering layer and disposed over a lower portion of the sidewall.

13. The device of claim 10, wherein the device comprises a transistor.

14. A method of making a device, comprising:
    forming a via that extends from a front side of a semiconductor substrate at least partially through a thickness of the substrate; and
    forming a strain engineering layer directly over a top surface of the substrate adjacent to the via and over only a portion of a sidewall of the via.

15. The method of claim 14, wherein the strain engineering layer is formed by chemical vapor deposition or atomic layer deposition.

16. The method of claim 14, wherein the strain engineering layer is formed over an upper portion of the sidewall.

17. The method of claim 16, further comprising forming an isolation layer over the strain engineering layer and directly over a lower portion of the sidewall.

18. The method of claim 14, further comprising filling the via with a conductive material.

* * * * *